United States Patent
Lin et al.

(10) Patent No.: US 9,978,628 B2
(45) Date of Patent: May 22, 2018

(54) BONDING METHOD INCLUDING ADJUSTING SURFACE CONTOURS OF A BONDING SYSTEM

(71) Applicant: TAIWAN SEMICONDUCTOR MANUFACTURING COMPANY, LTD., Hsinchu (TW)

(72) Inventors: Yu-Liang Lin, Hsinchu (TW); Weng-Jin Wu, Hsinchu (TW); Jing-Cheng Lin, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days. days.

(21) Appl. No.: 15/075,729

(22) Filed: Mar. 21, 2016

(65) Prior Publication Data
US 2016/0204014 A1   Jul. 14, 2016

Related U.S. Application Data

(62) Division of application No. 12/844,113, filed on Jul. 27, 2010, now Pat. No. 9,299,594.

(51) Int. Cl.
 H01L 21/68 (2006.01)
 H01L 21/683 (2006.01)
 (Continued)

(52) U.S. Cl.
 CPC .... *H01L 21/6835* (2013.01); *H01L 21/67092* (2013.01); *H01L 21/67109* (2013.01);
 (Continued)

(58) Field of Classification Search
 CPC .......... B29C 66/8141; B29C 66/81421; B29C 66/81422; B29C 66/81423;
 (Continued)

(56) References Cited

U.S. PATENT DOCUMENTS 4,393,766 A   7/1983   Thies
4,431,474 A   2/1984   Gronek et al.
(Continued)

FOREIGN PATENT DOCUMENTS

CN   1963643   5/2007

OTHER PUBLICATIONS

Office Action dated Nov. 30, 2012 from corresponding application No. CN 201110030337.3.
(Continued)

*Primary Examiner* — George Koch
(74) *Attorney, Agent, or Firm* — Hauptman Ham, LLP (57) ABSTRACT

A method of wafer bonding includes bonding a wafer to a carrier in a bonding system. The method further includes measuring thickness profile of the bonded wafer. The method further includes modifying surface contours of at least one of an upper plate or a lower plate of the bonding system during a bonding operation to improve planarity of bonded wafers based on the measured thickness profile, wherein modifying the surface contours of at least one of the upper plate or the lower plate comprises modifying the surface contours using a plurality of height adjusters.

20 Claims, 12 Drawing Sheets

(51) Int. Cl.
*H01L 21/66* (2006.01)
*H01L 21/67* (2006.01)
*H01L 23/00* (2006.01)
*H01L 25/065* (2006.01)

(52) U.S. Cl.
CPC .......... *H01L 21/6836* (2013.01); *H01L 22/26* (2013.01); *H01L 22/12* (2013.01); *H01L 24/05* (2013.01); *H01L 24/13* (2013.01); *H01L 24/16* (2013.01); *H01L 24/73* (2013.01); *H01L 24/81* (2013.01); *H01L 25/0652* (2013.01); *H01L 2221/6834* (2013.01); *H01L 2221/68327* (2013.01); *H01L 2224/0401* (2013.01); *H01L 2224/05009* (2013.01); *H01L 2224/0557* (2013.01); *H01L 2224/06181* (2013.01); *H01L 2224/13* (2013.01); *H01L 2224/131* (2013.01); *H01L 2224/13025* (2013.01); *H01L 2224/13147* (2013.01); *H01L 2224/16146* (2013.01); *H01L 2224/73204* (2013.01); *H01L 2224/81005* (2013.01); *H01L 2224/81191* (2013.01); *H01L 2224/81192* (2013.01); *H01L 2224/94* (2013.01); *H01L 2224/97* (2013.01); *H01L 2225/06513* (2013.01); *H01L 2225/06541* (2013.01); *H01L 2225/06548* (2013.01); *H01L 2924/00014* (2013.01); *H01L 2924/14* (2013.01); *H01L 2924/1461* (2013.01); *H01L 2924/3511* (2013.01)

(58) Field of Classification Search
CPC ........ B29C 66/81451; B29C 66/81453; B29C 66/81455; B29C 66/81457; B29C 66/81463; H01L 21/6835; H01L 22/12; H01L 22/26; H01L 2224/7525; H01L 2224/75251; H01L 2224/75252; H01L 2924/00014; H01L 2924/3511
USPC ......... 156/358, 359, 360, 581, 583.1, 583.3, 156/583.91; 100/258 A, 258 R
See application file for complete search history.

(56) References Cited

U.S. PATENT DOCUMENTS

| | | |
|---|---|---|
| 5,391,917 A | 2/1995 | Gilmour et al. |
| 5,496,433 A | 3/1996 | Miyashita et al. |
| 5,510,298 A | 4/1996 | Redwine |
| 5,578,159 A | 11/1996 | Miyashita et al. |
| 5,767,001 A | 6/1998 | Bertagnolli et al. |
| 5,772,815 A | 6/1998 | Jordan et al. |
| 5,807,455 A * | 9/1998 | Giordano ................. B30B 1/40 100/195 |
| 5,954,984 A | 9/1999 | Ablah et al. |
| 5,998,292 A | 12/1999 | Black et al. |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 7,866,364 B2 | 1/2011 | Chen et al. |
| 2002/0001920 A1 | 1/2002 | Takisawa et al. |
| 2003/0168176 A1 | 9/2003 | Byun et al. |
| 2003/0221777 A1 | 12/2003 | McHerron et al. |
| 2004/0033690 A1 | 2/2004 | Schowalter et al. |
| 2008/0047651 A1 | 2/2008 | Park |
| 2009/0020229 A1 | 1/2009 | Yoon et al. |
| 2009/0317960 A1 | 12/2009 | Izumi |

OTHER PUBLICATIONS

Office Action dated Apr. 8, 2013 from corresponding application No. TW 099146543.

Office Action dated Dec. 3, 2013 from corresponding application No. TW 099146543.

* cited by examiner

BONDING METHOD INCLUDING ADJUSTING SURFACE CONTOURS OF A BONDING SYSTEM

PRIORITY CLAIM

This application is a divisional of U.S. application Ser. No. 12/844,113, filed Jul. 27, 2010, now U.S. Pat. No. 9,299,594, which is incorporated herein by reference in its entirety.

FIELD

This application relates to packaging of semiconductor chips and, more particularly, to bonding semiconductor substrates.

BACKGROUND

The semiconductor industry has experienced continued rapid growth due to continuous improvements in manufacturing technologies and in integration density of various electrical devices (i.e., transistors, diodes, resistors, capacitors, etc.). For the most part, the improvement in integration density has come from repeated reduction in minimum feature sizes, which allow more devices to be integrated into a given area. Technologies, such as three-dimensional (3D) integrated circuits (ICs) and through silicon vias (TSVs), are therefore created to resolve the limitations of number and lengths of interconnections between devices as the number of devices increases. Such demands have resulted in the requirement for thinner semiconductor chips.

In order to meet the requirement of thinner semiconductor chips, the semiconductor industry has incorporated wafer backside thinning (or grinding) to obtain the thinner chips or dies required. This is accomplished by removing material from the backside of the wafers after the necessary circuit patterns and/or TSVs have been fabricated on the front side of the wafers. It is within this context the following disclosure arises.

BRIEF DESCRIPTION OF THE DRAWINGS

The present disclosure will be readily understood by the following detailed description in conjunction with the accompanying drawings, and like reference numerals designate like structural elements.

FIGS. 3F(I) and (II) show designs of shims, in accordance with some embodiments.

FIGS. 3I (A)-(C) show bottom views of various arrangements of height adjusters, in accordance with some embodiments.

DETAILED DESCRIPTION OF THE EXEMPLARY EMBODIMENTS

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 1A:
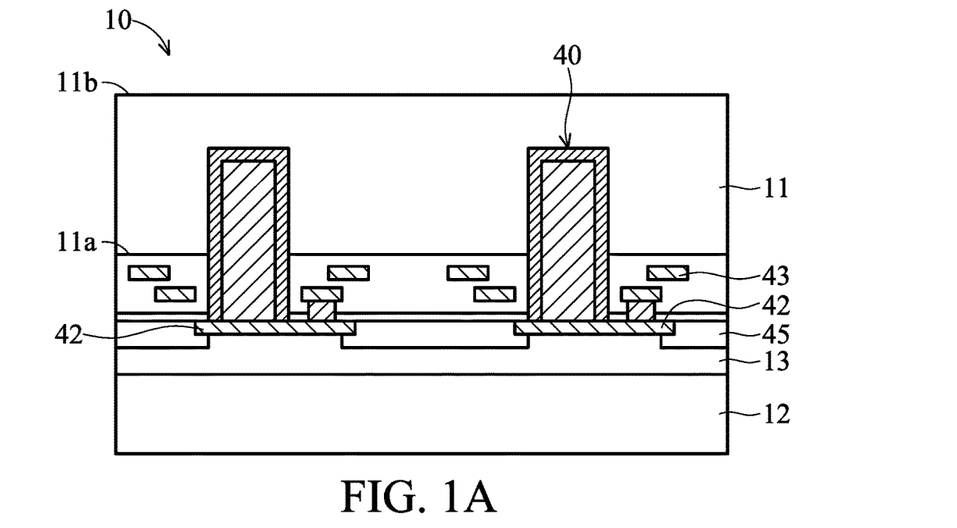
FIGS. 1A-1C show cross-section diagrams of a wafer with through silicon vias (TSVs) that undergoes bonding to a carrier, thinning and being bonded to dies, in accordance with some embodiments.

As shown in FIG. 1A, a wafer 10 comprises a semiconductor substrate 11 having a front surface 11a and a back surface 11b, wherein integrated circuits (not shown) and interconnect structures, such as structures 43, are formed on the front surface 11a. A number of through silicon vias (TSVs) 40 pass through at least a part of the semiconductor substrate 11. The TSVs 40 are metal-filled plugs extending from the front surface 11a toward the back surface 11b and reaching an intended depth, in some embodiments. The TSVs 40 electrically connect bond pads 42 formed on the interconnect structure, in some embodiments. The bond pads 42 are separated from one another by a dielectric layer 45. In some embodiments, the fabrication of the TSVs 40 is performed before the fabrication of "first-level interconnection" which refers to a lowermost metal layer, such as metal layer of structures 43, patterned in a lowermost inter-metal dielectric (IMD) layer overlying contact structures and electrical devices such as transistors (not shown). In some other embodiments, the metal-filled via process is performed after the fabrication of interconnect structures. In some embodiments, bumps (not shown) are formed over the bond pad 42. Such bumps enable substrate 11 to be placed on other substrate(s) or other semiconductor chips for 3-dimensional ICs (or 3D ICs).

Wafer 10 is attached to a carrier 12 by an adhesive layer 13 to facilitate a wafer (or substrate) thinning process, in accordance with some embodiments. Carrier 12 is used to provide support for wafer 10 and is used to hold the substrate (or wafer) in position. Carrier (or dummy substrate) 12 can be made of various solid materials. In some embodiments, carrier 12 is made of glass. In some embodiments, the adhesive layer 13 is made of a liquid glue, which can fill openings and space between wafer 10 and carrier 12. The liquid glue solidifies after being heated. In some embodiments, the liquid glue includes an epoxy polymer.

Figure 1B:
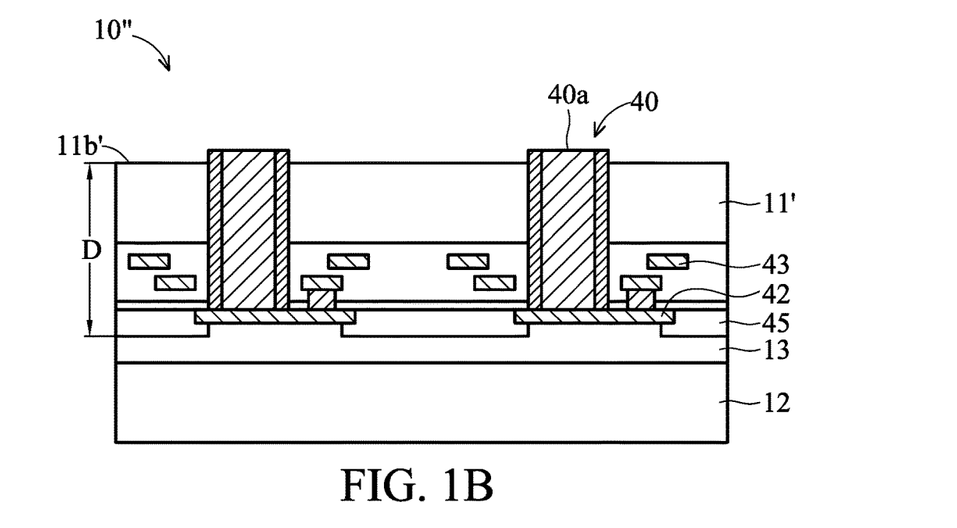

After attached to the carrier 12, the back surface 11b is then thinned to a desired final thickness "D," as shown in FIG. 1B. The thinning process can be done by processes, such as grinding, etching, and/or polishing. At the end of the thinning process, a thinned wafer 10" with a predetermined thickness "D", which depends on the purpose for which the semiconductor package is used, is formed. In at least one embodiment, the wafer 10 is thinned to a thickness "D" at a range between about 5 μm to about 50 μm. In another embodiment, wafer 10 is thinned to a thickness "D" between about 25 μm to about 250 μm. In yet another embodiment, wafer 10 is thinned to a thickness "D" between about 25 μm to about 100 μm. In the exemplary embodiment shown in FIG. 1B, ends 40a of TSVs 40 are exposed and protruded from the back surface 11b" of the thinned substrate 11' after the wafer thinning process.

Figure 1C:
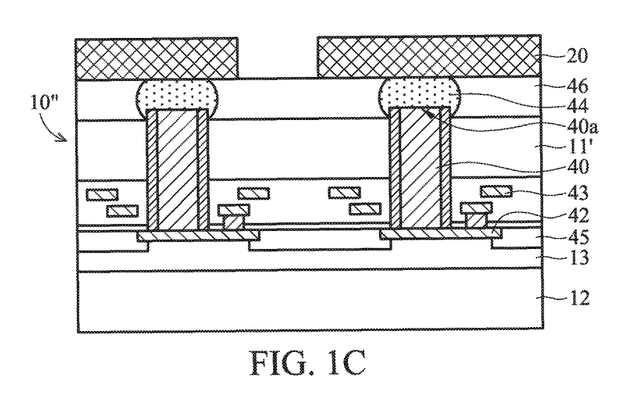

FIG. 1C shows a number of dies 20 are bonded onto the thinned wafer 10", forming a dies-to-wafer stack, in accordance with some embodiments. Backside metallization including electrical connections and/or other structures (referring to conductive structures 44) are formed over the surface 11b" of the thinned substrate 11'. Dies 20 are then bonded onto the thinned substrate 11' wherein the bonding methods may include commonly used methods, such as oxide-to-oxide bonding, oxide-to-silicon bonding, copper-to-copper bonding, adhesive bonding, and the like. Dies 20 may include memory chips, RF (radio frequency) chips, logic chips, or other chips. Each of the dies 20 has a first surface and a second surface, and integrated circuits are formed on the first surface. In some embodiments, the first surfaces of dies 20 are bonded to the thinned substrate 11'" (or thinned wafer 10"). In some other embodiments, the second surfaces of dies 20 are bonded to the thinned substrate 11' (or thinned wafer 10').

In the embodiment shown in FIG. 1C, conductive structures 44, such as solder bumps or copper bumps, are formed over the ends 40a of TSVs 40 to bond to the second surfaces or the first surfaces of dies 20. In some embodiments, the spaces between dies 20 and substrate 11' and the space between conductive structures 44 are filled with a dielectric layer 46. Conductive structures 44 may also include redistribution layers (RDLs) and pads which can be formed over the surface 11b" of the thinned wafer 10" before forming the solder bumps or copper bumps. In addition, under bump metallurgy (UBM) layer(s) (not shown) could be located between the bumps and I/O (input/output) pads.

Figure 1D:
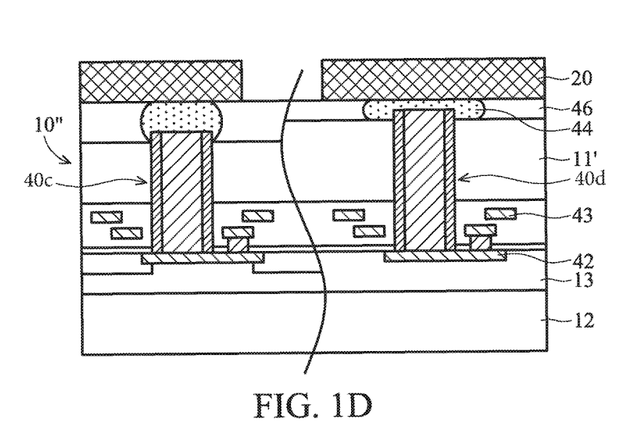
FIG. 1D shows a wafer with poor planarity after thinning being bonded to dies, in accordance with some embodiments.

FIG. 1C shows that both dies 20 are properly bonded to conductive structures 44. However, if wafer 10 were not flat before undergoing the thinning process, the protruding surface 11b of wafer 10 would be thinned more than the rest of surface 11b. The uneven amount of substrate 11 being removed would lead to some TSVs 40, such as TSV 40c, being shorter than others, such as TSV 40d, as shown in FIG. 1D in accordance with some embodiments. The difference in the heights of TSVs, such as shorter TSV 40c compared to taller TSV 40d, could lead to shorter TSVs (such as TSV 40c) not being connected (or bonded) to dies 20 and the conductive structures 44 for taller TSVs (such as TSV 40d) being squeezed thin. The squeezed conductive structures 44 for taller TSVs (such as TSV 40d) could spread to nearby structures (not shown) and result in shorting (also called bridging). Both non-bonding and shorting (or bridging) would reduce yield and/or reliability issues.

Figure 2A:
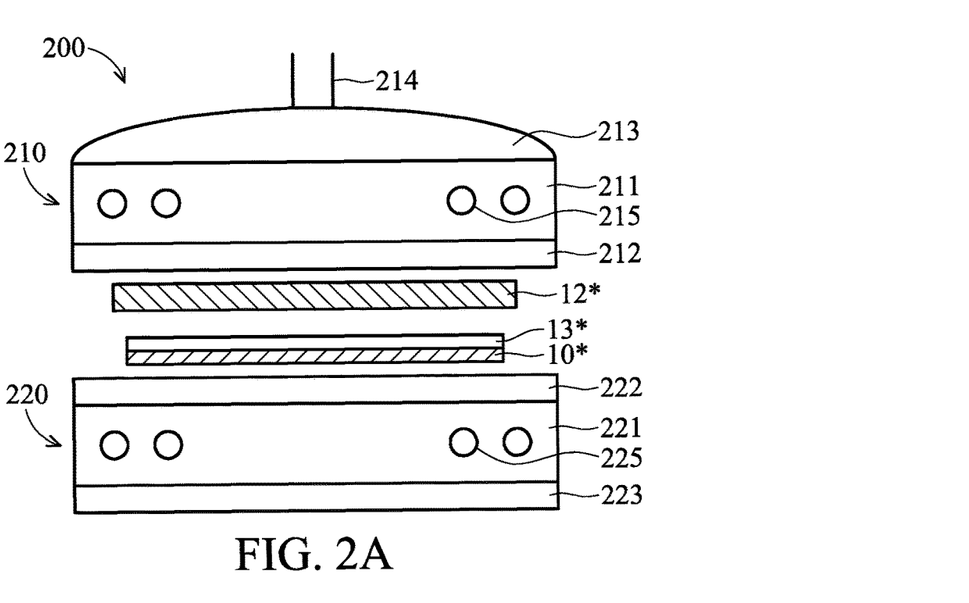
FIG. 2A shows a bonding system, in accordance with some embodiments.

Improper bonding of wafer 10 to carrier 12 could result in uneven wafer surface prior to the thinning (or grinding) process. FIG. 2A shows an apparatus 200 used to bond wafer 10* to carrier 12*, in accordance with some embodiments. Wafer 10* is similar to wafer 10 and carrier 12* is similar to carrier 12 of FIGS. 1A-1D. The apparatus 200 has an upper assembly 210 and a lower assembly 220, in accordance with some embodiments. The upper assembly 210 includes an upper body 211, which has a number of upper heating coils (or upper heating elements) 215 used to increase the temperature of the upper assembly 210. The upper heating coils 215 are connected to a controller (not shown). The upper assembly 210 also includes an upper plate 212, which comes in contact with the bonding material, such as carrier 12* or wafer 10*. In some embodiments, the upper body 211 and the upper plate 212 are combined into one piece. In some embodiments, the upper plate 212 is made of a dielectric material. In some embodiments, the dielectric material is ceramic ($Al_2O_3$). In addition, the upper body 211 is made of a dielectric material, in some embodiments. The dielectric material may be made of ceramic ($Al_2O_3$), in some embodiments.

The upper assembly further includes a top plate 213 and a shaft 214. Shaft 214 is used to move the upper assembly up or down, in some embodiments. A downward force can be applied by shaft 214 to the top plate 213 of the upper assembly 210 and the downward force can be transferred to the upper plate 212 to press against the bonding material (wafer-10*/adhesion-layer-13*/carrier-12*sandwich).

Apparatus 200 also includes a lower assembly 220, in some embodiments. The lower assembly 220 includes a lower body 221, which also has a number of lower heating coils (or lower heating elements) 225 used to increase the temperature of the lower assembly 220. The lower heating coils 225 are connected to a controller (not shown), which may be the same controller for the upper heating coils 215 in some embodiments. In some embodiments, the lower heating coils 225 and the upper heating coils 215 are controlled by separate controllers (not shown). The lower assembly 220 also includes a lower plate 222, which faces the upper plate 212 and comes in contact with the bonding materials (wafer-10*/adhesion-layer-13*/carrier-12* sandwich). In some embodiments, the lower body 221 and the lower plate 222 are combined into one piece. In some embodiments, the lower plate 222 is made of a dielectric material. Examples of dielectric materials for the lower plate 222 may include, but are not limited to, ceramic ($Al_2O_3$), silicon carbide, stainless steel, etc. The dielectric material(s) used for the lower plate 222 should be stable in the environment and maintains its form. In some embodiments, the lower body 221 is made of a ceramic ($Al_2O_3$). In some embodiments, the lower assembly 220 further includes a support structure 223, which support the lower body 221 and the lower plate 222.

To bond wafer 10* to a carrier 12*, an adhesive layer 13* is first applied (or placed) on a surface of wafer 10*. In some embodiments, the adhesive layer 13* includes monomers for a thermoplastic epoxy polymer, which is in liquid form when heated and turns into a solid when cooled down. The adhesive layer 13* may also include other elements, such as filler, cross-linking agent, anti-oxidant, etc. When the adhesive layer 13* is heated in the bonding system to the process temperature, the monomers transform into thermoplastic polymer(s).

In some embodiments, wafer 10" is first placed on the lower plate 222, in some embodiments. The carrier 12* is then placed over wafer 10* with the adhesive layer 13* being sandwiched therebetween. In some embodiments, the adhesive layer 13* has a thickness between about 100 µm to about 150 µm. A downward force is applied through the shaft 214 to the top assembly 210, and then to the sandwich of carrier 12*, adhesive layer 13*, and wafer 10*. In some embodiments, the carrier 12*, the adhesive layer 13*, and the wafer 10* are heated at a temperature between about 200° C. to about 220° C. for the adhesive layer 13* to fill the space between carrier 12* and wafer 10*. The heating processing also allows the moisture in the adhesive layer 13* to be driven out, in some embodiments. In some embodiments, the bonding process last between about 1 minute to about 5 minutes.

Figure 2B:
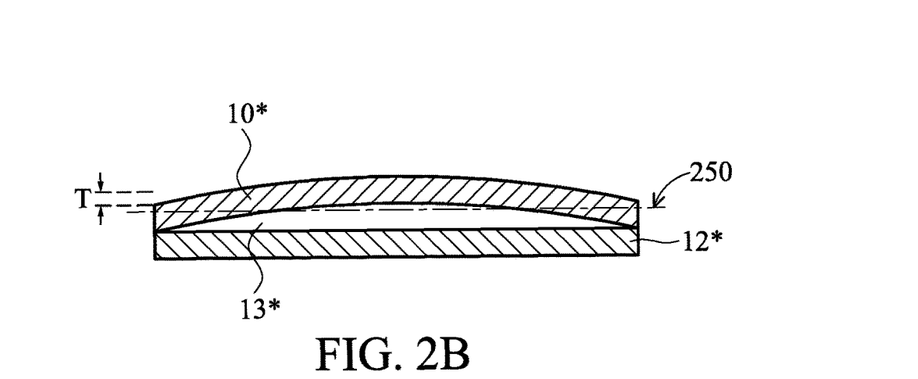
FIG. 2B shows a wafer being bonded to a carrier, in accordance with some embodiments.

FIG. 2B shows wafer 10* being bonded to carrier 12*, in accordance with some embodiments. FIG. 2B shows that the center portion of wafer 10* is higher than the rest of the wafer. Thickness measurement shows that the total thickness variation (TTV) could be about 20 µm or greater, in some embodiments. Total thickness variation is measured by the difference between the maximum and minimum thicknesses. FIG. 2B shows that the thickness of the adhesive layer 13* is not even, with the center area being thicker than the edge area. The center region is thicker than the edge region by an amount of "T". In some embodiments, the TTV of a substrate can be measured by various tools, such as a profilometer, an atomic force miscroscope, or a layer thickness measurement tool. An example of a layer thickness measurement tool is a StraDex, made by ISIS SENTRONICS of Mannheim, Germany. StraDex can measure thickness of an individual layer in a composite film (including sandwich layers).

Figure 2C:
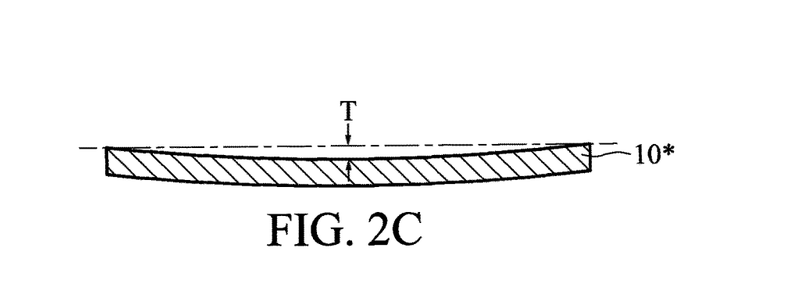
FIG. 2C shows the wafer of FIG. 2B after being thinned and removed from the carrier, in accordance with some embodiments.

FIG. 2B also shows a dotted line 250 indicating the finishing line of the thinning process, in accordance with some embodiments. After the thinning process, wafer 10* becomes wafer 10# and is separated from carrier 12*. FIG. 2C shows wafer 10# after being detached from carrier 12* and the adhesive layer 13*, in accordance with some embodiments. FIG. 2C shows that the center of wafer 10# is thinner than the peripheral areas of wafer 10# by the amount of "T" (the difference in thickness as depicted in FIG. 2B). The TSVs in the center area are likely being over-ground (or over-polished) in a similar manner as TSV 40c of FIG. 1D. Due to the un-even surface and its scale of non-uniformity, the TSVs in the center region could possibly not be bonded to chips, such as chips 20, in a similar manner as TSV 40c of FIG. 1D. The TSVs in the edge region can also possibly cause bridging in the peripheral area of wafer 10#. The TTV of wafer 10* needs to be substantially reduced to avoid such occurrence. In some embodiments, the TTV of wafers after the thinning process is less than about 5 µm. In some other embodiments, the TTV of wafers after the thinning process is less than about 2 µm. In yet some other embodiments, the TTV of wafers after the thinning process is less than about 1 µm. Many applications require substrate thinning. For example, the applications may include, but are not limited to, substrate packaging, TSVs, microelectromechanical systems (MEMs), 3D ICs, and other thin wafer handling applications. The TTV requirements depend on the applications and process technologies. However, as device density increases for advanced technologies, the TTV requirement after wafer thinning continues to decrease.

Figure 2D:
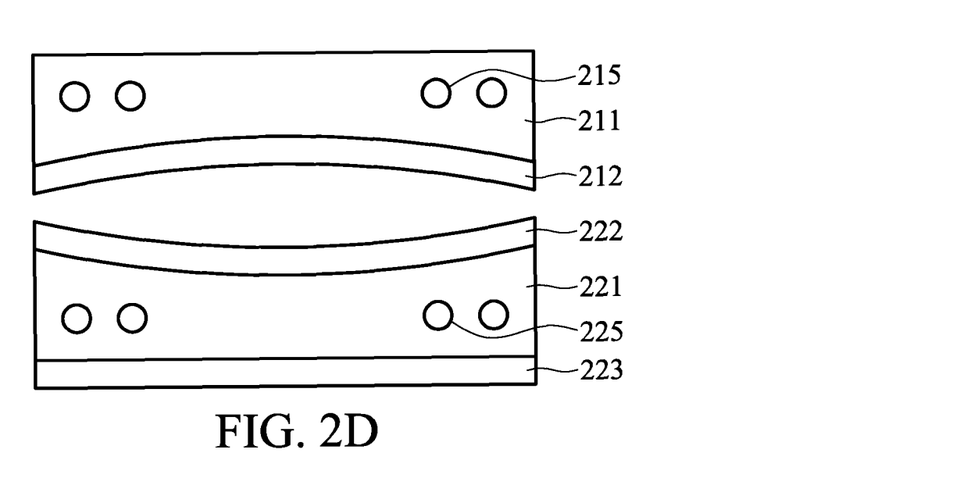
FIG. 2D shows expanded edge regions of upper and lower plates, in accordance with some embodiments.

The causes of wafer 10* protruding in the center area after bonding process could be various. One cause could be attributed to the upper heating coils 215 and the lower heating coils 225 being on the peripheral portions of the upper body 211 and lower body 221. The heating coils could cause the surfaces of the upper plate 212 and the lower plate 222 to be un-evenly expanded, with the peripheral surfaces being expanded more, as shown in FIG. 2D in accordance with some embodiments. The protruding peripheral surfaces of upper plate 212 and lower plate 222 squeeze (or press) harder (or stronger) near the edges (or peripheral regions) of wafer 10* and carrier 12* to make the adhesive layer 13* thinner near the edges (or peripheral regions) of wafer 10* and carrier 12*. As a result, the center portion of wafer 10* protrudes outward and the center portion of the adhesive layer 13* is thicker, as shown in FIG. 2B.

Figure 2E:
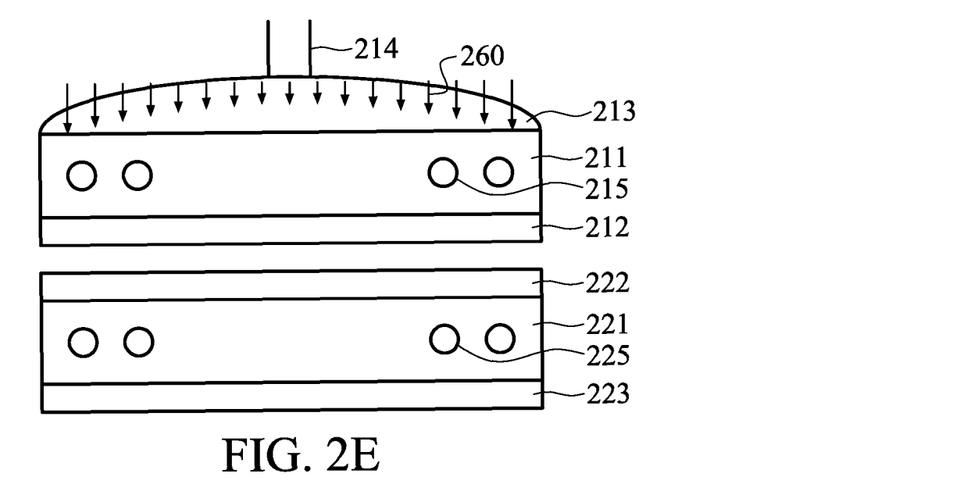
FIG. 2E shows un-even forces being applied on the upper assembly, in accordance with some embodiments.

Another possible cause of un-even wafer surface after the bonding process is in-balanced force applied on the upper plate 212. FIG. 2E shows forces 260 applied on the upper assembly 210, in accordance with some embodiments. It is possible that due to the design of top plate 213 and the mechanism used to apply the forces 260 on the upper plate 212, forces 260 are stronger near the peripheral areas of wafer 10* to make the sandwich (wafer/adhesive-layer/carrier) thinner at the peripheral region.

In order to improve planarity or TTV of wafer 10# after the thinning process, the planarity of the sandwiched layers with wafer-10*/adhesive-layer-13*/carrier-12* needs to be improved. In some embodiments, the surface of upper plate 212 facing the lower plate 222 and the surface of is pre-shaped (or pre-polished) to be thinner at the peripheral regions. In some embodiments, the amount thinned and the areas thinned correlate to the thicker amount at the center region of the post-bonding wafer, such as the sandwich layers of FIG. 2B. The contour of the thinner peripheral regions of the upper plate 212 compensates the effect of having thinner peripheral region of the bonded sandwich.

Figure 3A:
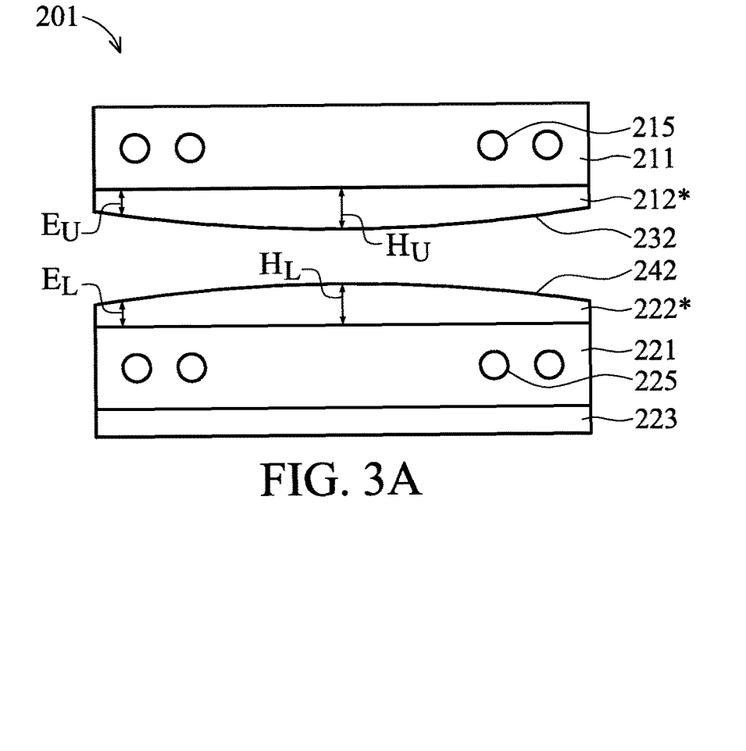
FIG. 3A shows a portion of a bonding apparatus with the surfaces of upper plate and lower plate being re-shaped, in accordance with some embodiments.

FIG. 3A shows a portion 201 of a bonding apparatus 200*, which is similar to apparatus 200, in accordance with some embodiments. The portion 201 of the apparatus 200* has a finished upper surface 232 of the upper plate 212* and a finished lower surface 242 of the lower plate 222* that are thicker in the center region and thinner at the peripheral regions. Surfaces 232 and 242 are smooth. Thickness $H_U$ at the center is higher than thickness $E_U$ at the edge for the upper plate 212*. Similarly, Thickness $H_L$ at the center is higher than thickness $E_L$ at the edge for the lower plate 222*. The upper plate 212* and the lower plate 222* are thinner at the peripheral regions to reduce the force exerted on the wafer/adhesion-layer/carrier sandwich in the peripheral regions.

Figure 3B:
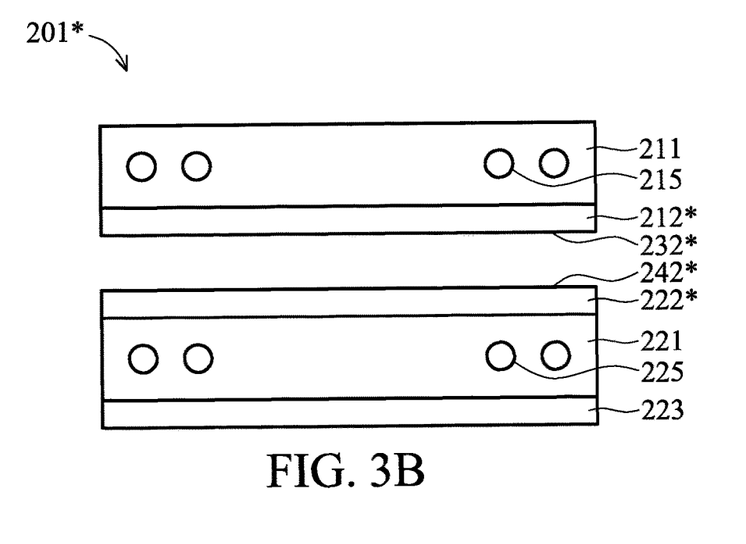
FIG. 3B shows the portion of the bonding apparatus of FIG. 3A at operating temperature, in accordance with some embodiments.

In some embodiments, the thinner peripheral regions of the upper plate 212* and lower plate 222* compensate for thermally expanded peripheral regions when the upper plate 212* and the lower plate 222* are heated up, which make surfaces 232 and 242 flat when apparatus 200* is heated to operating temperature, such as between about 200° C. to about 220° C. In such embodiments, the portion 201 of the bonding apparatus 200* is at room temperature in FIG. 3A. FIG. 3B shows portion 201* after the apparatus 200* is heated to the operating temperature (by coils 215 and 225), in accordance with some embodiments. FIG. 3B shows that surface 232 and surface 242 become flat surfaces 232* and 242* after heating.

Figure 3C:
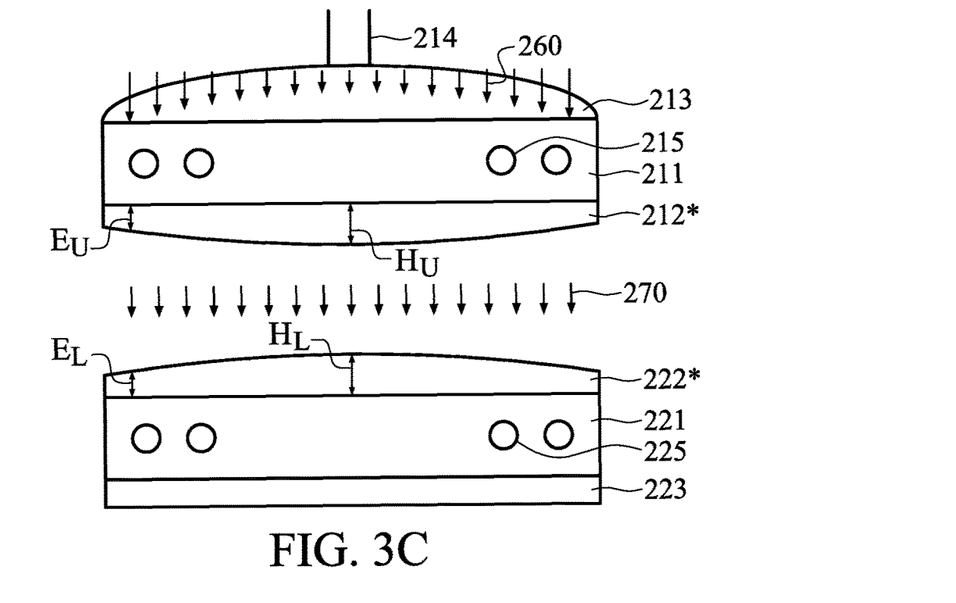
FIG. 3C shows an un-even force with applied on a top plate of a bonding system, in accordance with some embodiments.

In some other embodiments, the thinner peripheral regions of upper plate 212* and lower plate 222* compensates for the higher force 260 at the peripheral regions applied by the top plate 213 and as a result exerts about the same amount of pressure 270 across the bonded sandwich (not shown). FIG. 3C shows the pressure 270 to be about the same across the sandwich layers, in accordance with some embodiments. The thinning of the peripheral regions of the upper plate 212* and the lower plate 222* reduces TTV of the wafer/adhesion-layer/carrier sandwich after bonding and also reduced TTV of wafer after wafer thinning (such as by grinding). In some embodiments, only the upper plate 212* or the lower plate 222* is thinned at the peripheral regions. However, if the uniformity (or planarity) of bonded and/or post-thinning wafer has other patterns (not center thick as described in the examples above), the upper plate 212* and/or lower plate 222* can be re-surfaced (or pre-surfaced) into other patterns to compensate for the non-uniformity patterns and to improve planarity.

Figure 3D:
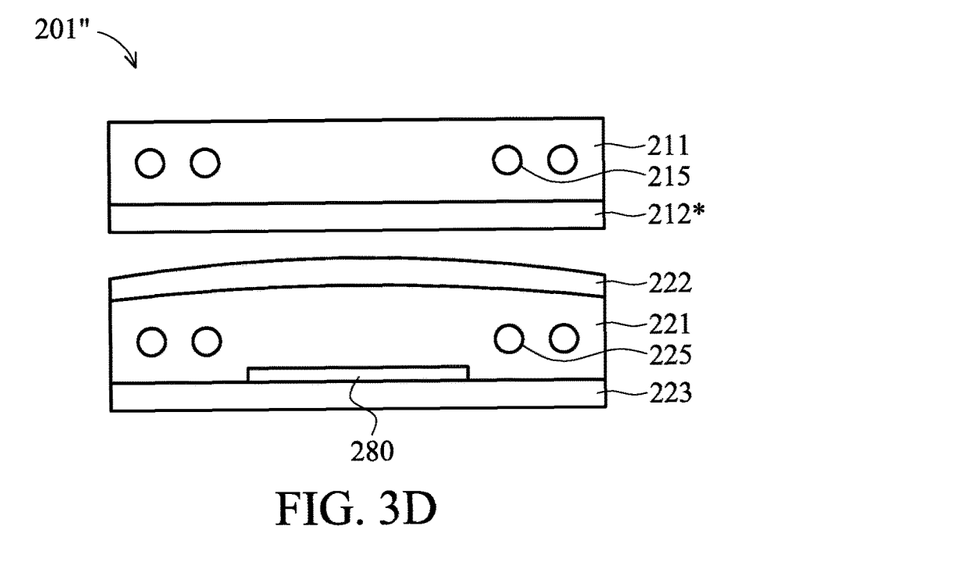
FIG. 3D shows a shim being inserted under the lower body to change the contour of the lower plate, in accordance with some embodiments.

FIG. 3D shows a portion 201" of bonding apparatus 200" similar to bonding apparatus 200, in accordance with some embodiments. FIG. 3D shows that a shim (or 1 washer) 280 is inserted between support structure 223 and lower body 221. The shim 280 is placed in the center region to increase the height of the center region(s) of lower plate 222. In some embodiments, the height of shim 280 correlates to the additional height "T" of the thicker center region, which is subsequently removed as shown in FIG. 2C, of the wafer/adhesive-layer/carrier sandwich as shown in FIG. 2B. In some embodiments, the thickness of shim 280 is between about 10 μm to about 20 μm. In some other embodiments, the thickness of shim 280 is between about 5 μm to about 15 μm. In some embodiments, the diameter of shim 280 is about ⅔ of the diameter of the thicker center region. In some embodiments, the diameter of shim 280 is between about 10 mm to about 25 mm. In some other embodiments, the diameter of shim 280 is between about 15 mm to about 25 mm.

Table I shows TTV data of two samples, Sample I and Sample II, with (W shim) and without (W/O) using a shim about 15 μm thick and with a diameter of about 20 cm between the lower body 221 and the support structure 223, in accordance with some embodiments. Samples 1-4 are sandwiches of wafer/adhesive-layer/carrier structures. The total thickness described in Table I is total thickness of the sandwich.

| SAMPLES | Total Thickness (μm) | TTV (μm) |
| --- | --- | --- |
| SAMPLE 1 (W/O) | 1,648 | 20 |
| SAMPLE 2 (W/O) | 1639 | 18 |
| SAMPLE 3 (W shim) | 1652 | 4 |
| SAMPLE 4 (W shim) | 1633 | 5 |

Table I shows total thicknesses and TTVs of samples after bonding operations.

Table I shows that samples 1 and 2 that were bonded by a bonding equipment without adding a shim described above. Samples 1 and 2 have higher TTVs, such as 20 μm and 18 μm. In contrast, samples 3 and 4 that were bonded using a bonding equipment with a shim have TTVs at 4 μm and 5 μm respectively. Adding a shim below the lower plate 221 helps to reduce the TTVs post bonding and consequently helps reduce over-thinning (or over-polishing, or over-grinding) of wafers near the wafer center region.

Figure 3E:
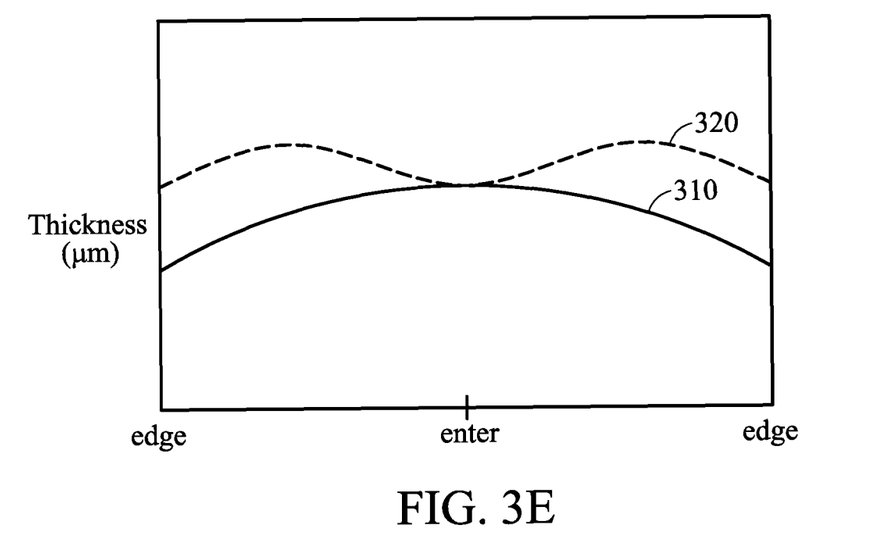
FIG. 3E shows thickness variation data across wafers for a wafer bonded without the shim in the system and a wafer bonded with a shim in the bonding system, in accordance with some embodiments.
Figure 3F:
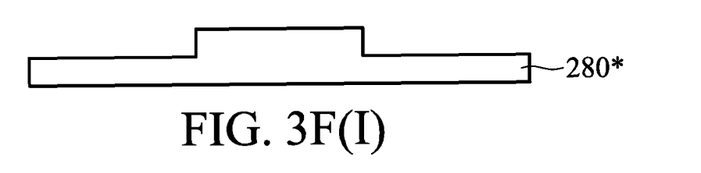

FIG. 3E shows thickness variation data across wafers for a wafer bonded without the shim in the system (Curve 310) and a wafer bonded with a shim in the bonding system (Curve 320), in accordance with some embodiments. The data show that Curve 320 is much flatter and has less TTV than curve 310. The TTV of curve 310 is about 20 μm and the TTV of curve 320 is about 5 μm. The data also show that curve 320 is lower at wafer center and edges, and is higher in between. To further reduce the TTV, the shim can be shaped differently. FIG. 3F(I) shows another embodiment of shim design to correct Curve 310 of FIG. 3E. Shim 280* has a center region that is taller (or thicker) than the edge region. Shim 280* resembles curve 310 of FIG. 3E more than shim 280. As a result, shim 280* could further reduce TTVs after bonding and after thinning, in comparison to shim 280. Further optimization to reduce the TTV across wafers after bonding and after thinning is possible by modifying the designs of the shim. FIG. 3A(II) shows a shim 280', which has a curved surface 285, shaped to resemble the surface contour (i.e. Curve 310) after bonding, in accordance with some embodiments. Curved surface 285 enables the correction of pressure applied on the sandwich layers and enables the production of a flat surface after the bonding process.

Figure 3G:
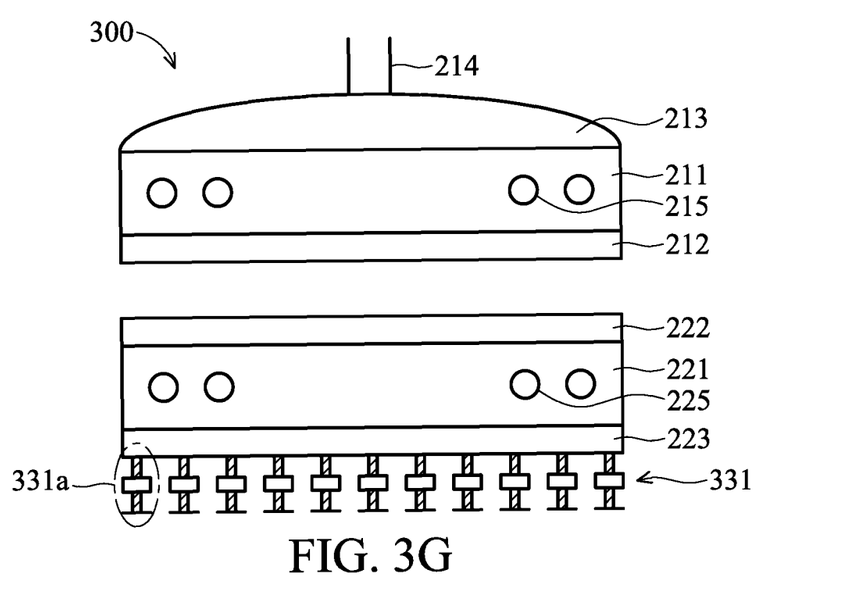
FIG. 3G shows a bonding system with height adjusters, in accordance with some embodiments.
Figure 3H:
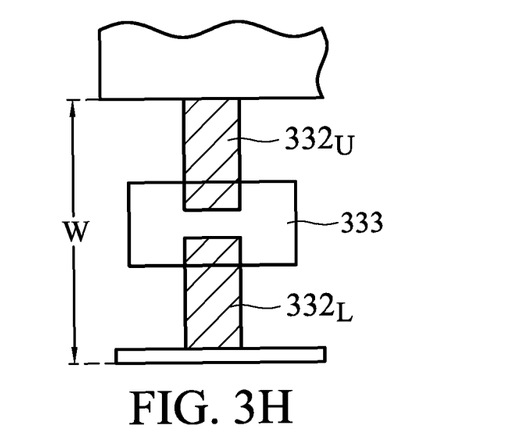
FIG. 3H shows a height adjuster, in accordance with some embodiments.
Figure 3I:
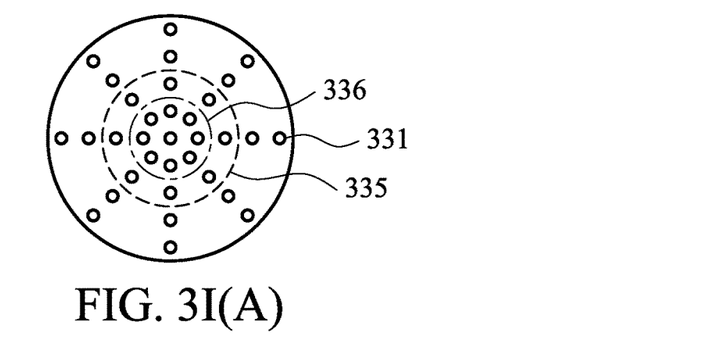

In addition to using an inserted shim to improve TTV across wafer, the shape or contour of the upper and/or lower plate can be modified (or adjusted) across the diameter of the upper and/or plate(s). FIG. 3G shows a design of a bonding apparatus 300, in accordance with some embodiments. Bonding apparatus 300 is similar to bonding apparatus 200 described above. However, bonding apparatus 300 has a number of height adjusters 331 attached to the support structure 223. In some other embodiments, the height adjusters 331 are placed directly under lower body 221 and the support structure 223 may be omitted. The height adjusters 331 are distributed under the support structure 223 and can be individually adjusted. FIG. 3H shows an enlarged adjuster 331a, in some embodiments. Adjuster 331a has an upper bolt $332_U$ and a lower bolt $332_L$. The upper bolt $332_U$ and the lower bolt $332_L$ are connected by a nut 333. The height of the adjuster 331a can be modified by moving the lower bolt $332_L$ or upper bolt $332_U$ up or down to affected the height "H" of adjuster 331a. The different adjusters 332 can be individually adjusted to optimize the surface contour of lower plate 222 to compensate for the effect that may cause uneven surface of the bonded sandwich. For example the adjusters 331 near the center regions can be adjusted to be higher to make the lower plate to be higher in the center region to compensate for the thicker edge regions of upper and/or lower plates. However, if the uniformity (or planarity) of bonded and/or post-thinning wafer has other patterns (not center thick as described in the examples above), the heights of the adjusters 331 can be raised or lowered to compensate for the non-uniformity patterns and to improve planarity.

FIG. 3I(A) shows a bottom view of FIG. 3G, in accordance with some embodiments. FIG. 3I(A) shows that the adjusters 331 are distributed symmetrically under the support structure 223. The adjusters 331 in FIG. 3I(A) are aligned in 8 rows. However, any number of rows that are greater than or equal to 3 are possible, such as 3, 4, 5, 6, 7, 8, . . . 12, . . . , etc. FIG. 3I(A) also shows a curve 335 and the region inside curve 335 is considered inner region. In some embodiments, adjusters 331 in this inner region (inside curve 335) can be adjusted to be higher to push up the height of the lower plate 222 in the center region. In addition, there could be another curve 336 and the adjusters inside region 336 are adjusted to a height that is different from adjusters between curves 335 and 336. The arrangement of the adjusters allows modifying heights of the lower plate 222 to have different heights in different zones. In some other embodiments, the adjusters 331 do not need to be arranged in the manner as shown in FIG. 3I(A). They can be arranged differently. FIGS. 3I(B) and 3I(C) show two other arrangements of adjusters, in accordance with some other embodiments. Other types of arrangements are also possible. FIG. 3I(B) has more adjusters in the center region, in comparison to the edge region. In some embodiments, the adjusters are arranged to allow adjusting the heights in zones. The example described in FIG. 3I(A) are concentric zones. However, the zones do not need to be concentric. For example, the adjusters can be adjusted based according to zones, such as zones, I, II, III, IV, V in FIG. 3I(C). Other configurations and number of zones are also possible. The adjustment pattern should be determined based on the wafer planarity pattern after bonding and/or after thinning. The area with thinner thickness post thinning (such as by grinding) needs to be adjusted higher.

Figure 3J:
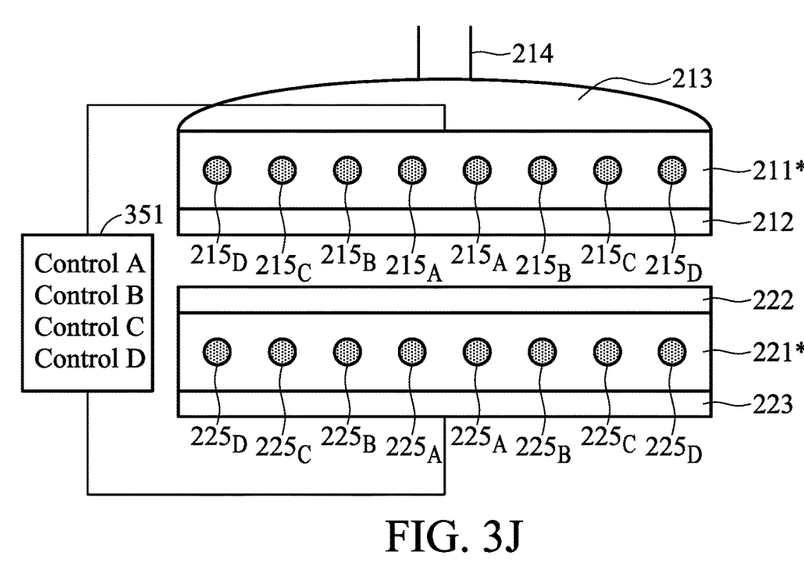
FIG. 3J shows a bonding system, in accordance with some embodiments.
Figure 3K:
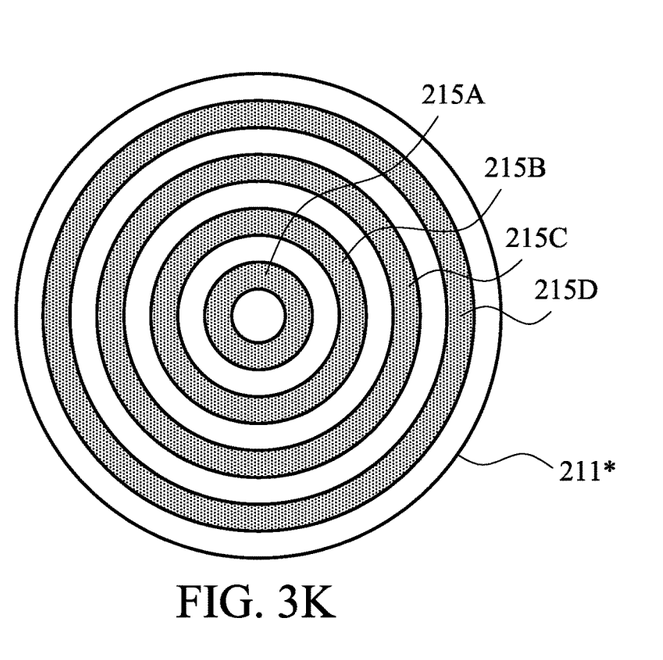
FIG. 3K shows a top view of heating elements in an upper plate, in accordance with some embodiments.
Figure 3L:
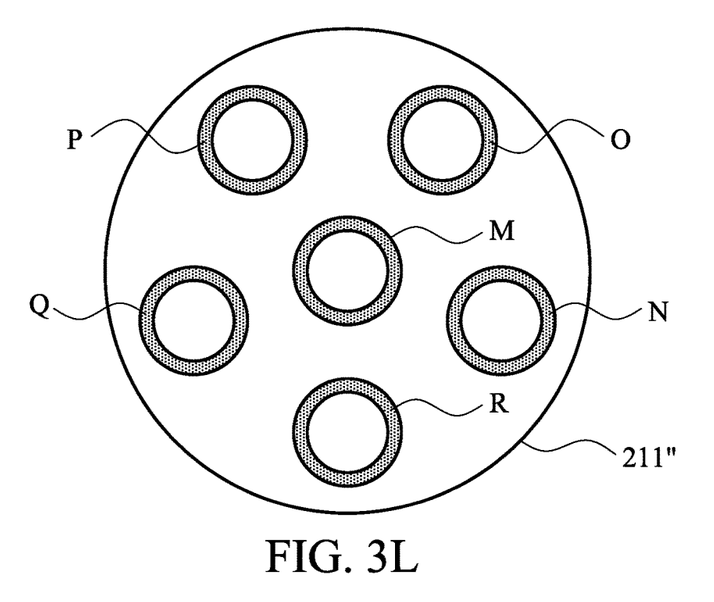
FIG. 3L shows a top view of heating elements in an upper plate, in accordance with some embodiments.

There are other ways to improve planarity of bonded wafers. FIG. 3J shows a bonding system 350, in accordance with some embodiments. Bonding system 350 has different heating elements in upper body 211\* and lower body 221\*. The different heating elements can be individually controlled to improve planarity of bonded wafers. Multiple heating elements, such as coils $215_A$, $215_B$, $215_C$, $215_D$, spread across the upper body 221\* and heating elements $225_A$, $225_B$, $225_C$, $225_D$ spread across the lower body 221\* allow better control of local temperature of upper plate 212 and lower plate 222 and also more uniform temperatures across upper plate 212 and lower plate 222. FIG. 3J shows a controller 351 used to control the temperature of upper plate 2121 and lower plate 222, in accordance with some embodiments. In some embodiments, the temperatures of the upper plate 212 and the lower plate 222 are controlled to be uniform across the plates. In some other embodiments, the temperature of upper plate 212 and lower plate 222 are controlled based on concentric zones, such as zones A, B, C, D, as shown in FIG. 3J, to correct the non-uniformity caused by the bonding system. FIG. 3K shows a top view of heating elements in upper body 211\* of FIG. 3J, in accordance with some embodiments. The top view of heating elements in lower body 221\* is similar to the arrangement shown in FIG. 3K for the heating elements in the upper body 212\*. Alternatively, the heating elements do not need to be concentric and can be controlled independently. FIG. 3L shows a top view of heating elements M, N, O, P, Q, R, which are not concentric, in a top body 211″, in accordance with some embodiments. Each of the heating elements can be adjusted independently. Other numbers and arrangement of heating elements are also possible.

Figure 4:
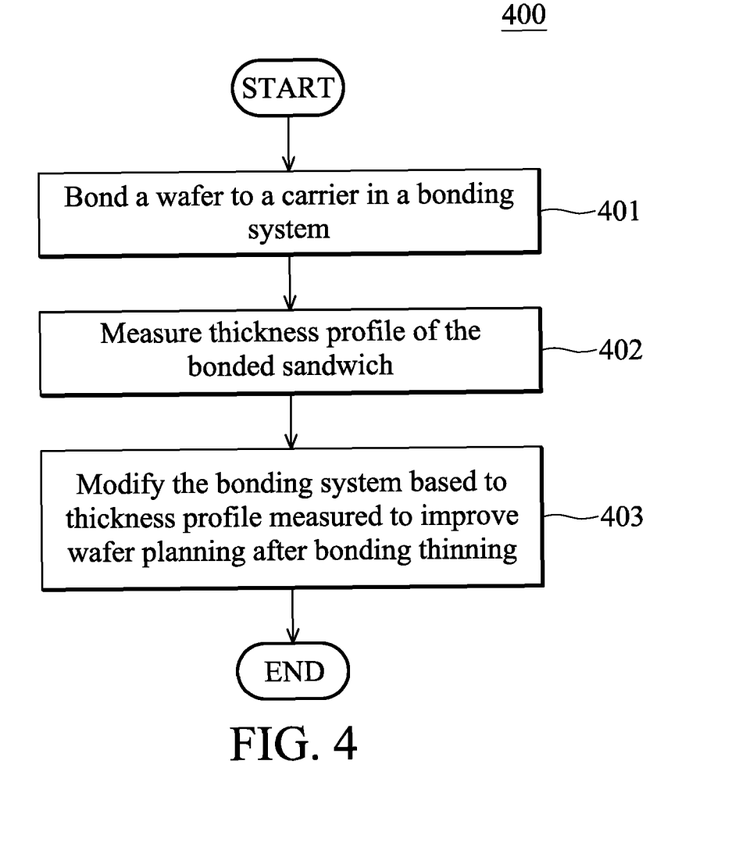
FIG. 4 shows a process flow of modifying a bonding system, in accordance with some embodiments.

FIG. 4 shows a process flow 400 of modifying a bonding system to improve planarity of bonded wafer, in accordance with some embodiments. At operation 401, a wafer is bonded to a carrier by using an adhesive layer between them in a bonding system. In some embodiments, the bonding system has an upper plate and a lower plate. The wafer is first applied with an adhesive layer on a surface to be bonded and then placed on the lower plate. The carrier is then placed on the adhesive layer. The upper plate is lowered to press against the carrier. The upper and lower plates press against each other to bond the wafer to the carrier. In some embodiments, the bonding system is operated at a temperature between about 200° C. to about 220° C., and the adhesive layer is a thermoplastic material. At operation 402, the thickness profile of the bonded sandwich (or sandwich layers) is measured.

At operation 403, the bonding system is modified based on the measured thickness profile to increase planarity of bonded sandwiches formed in the modified system. As mentioned above, there are many ways to modify the bonding system to improve planarity of bonded wafers. For example, the top plate and/or the bottom plate can be re-surface to improve planarity. The upper and/or lower plates comes in contact with the sandwich layers can be re-shaped (or re-surfaced) to compensate for the non-planarity caused by the bonding system. For example, for surface(s) of upper or/and lower plate protrude out more in the areas of bonded sandwich that are thicker. Alternatively, one or more shims (or washers) can be placed below the lower plate. As described above, the shim(s) can be placed under lower body 221. In some embodiments, a number of height adjusters can be placed under the support structures 223 or lower body 221 of the bonding system. In some embodiments, the design of the heating elements in the upper and/or lower bodies can be modified to improve planarity. Some of the different designs of the heating elements have been described above. The modified bonding apparatus can improve wafer planarity after bonding and after thinning. In some embodiments, the total thickness variation of bonded sandwich formed by the modified system is equal to or less than about 5 μm. In some other embodiments, the total thickness variation of bonded sandwich formed by the modified system is equal to or less than about 2 μm.

The embodiments described provide apparatus and methods for bonding wafers to carriers with improved planarity to satisfy needs to substrate packaging and device integration. The surface contours of plates facing the substrates or carriers are modified either by re-shaping, by using height adjusters, by adding shim(s), or by zoned temperature control. The modified surface contours of such plates compensate for the non-planarity of bonded substrates caused by an un-modified bonding system.

One aspect of this description relates to a bonding method. The method includes bonding a wafer to a carrier in a bonding system. The method further includes measuring thickness profile of the bonded wafer. The method further includes modifying surface contours of at least one of an upper plate or a lower plate of the bonding system during a bonding operation to improve planarity of bonded wafers based on the measured thickness profile, wherein modifying the surface contours of at least one of the upper plate or the lower plate comprises modifying the surface contours using a plurality of height adjusters.

Another aspect of this description relates to a bonding method. The method includes bonding a wafer to a carrier in a bonding system. The method further includes measuring thickness profile of the bonded wafer. The method further includes modifying surface contours of at least one of an upper plate or a lower plate of a bonding system based on the measured thickness profile, wherein modifying the surface contours of at least one of the upper plate or the lower plate comprises inserting a shim between a support structure of the bonding system and at least one of the upper plate or the lower plate.

Still another aspect of this description relates to a bonding method. The method includes bonding a wafer to a carrier in a bonding system. The method further includes measuring thickness profile of the bonded wafer. The method further includes modifying surface contours of at least one of an upper plate or a lower plate of a bonding system based on the measured thickness profile. Modifying the surface contours of at least one of the upper plate or the lower plate includes heating the upper plate, and heating the lower plate. Modifying the surface contours of at least one of the upper plate or the lower plate further includes exerting a physical force on the at least one of the upper plate or the lower plate, wherein the physical force is exerted on a surface of the at least one of the upper plate or the lower plate opposite a surface configured to contact a wafer.

Various modifications, changes, and variations apparent to those of skill in the art may be made in the arrangement, operation, and details of the methods and systems disclosed. Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A bonding method comprising:
   bonding a wafer to a carrier in a bonding system;
   measuring thickness profile of the bonded wafer; and
   modifying surface contours of at least one of an upper plate or a lower plate of the bonding system during a bonding operation to improve planarity of bonded wafers based on the measured thickness profile, wherein modifying the surface contours of at least one of the upper plate or the lower plate comprises modifying the surface contours by mechanically adjusting a height of at least one height adjuster of a plurality of height adjusters.

2. The bonding method of claim 1, wherein surfaces of the upper plate and the lower plate that are configured to face the wafer are re-shaped to compensate for a non-planarity of the bonded wafer.

3. The bonding method of claim 1, wherein the plurality of height adjusters is placed under the bonding system to adjust the surface contour of the lower plate being configured to face the wafer.

4. The bonding method of claim 1, wherein heating elements for the bonding system are re-designed to include a plurality of upper heating elements in an upper assembly and a plurality of lower heating elements in a lower assembly, and wherein the plurality of upper heating elements and the plurality of lower heating elements are controlled in zones.

5. The bonding method of claim 1, modifying the surface contours comprises individually controlling at least one height adjuster of the plurality of height adjusters.

6. The bonding method of claim 1, wherein the total thickness variation of bonded wafers is less than about 2 µm.

7. A bonding method comprising:
   bonding a wafer to a carrier in a bonding system;
   measuring a thickness profile of the bonded wafer; and
   modifying surface contours of at least one of an upper plate or a lower plate of a bonding system based on the measured thickness profile, wherein modifying the surface contours of at least one of the upper plate or the lower plate comprises inserting a shim between a support structure of the bonding system and at least one of the upper plate or the lower plate.

8. The bonding method of claim 7, wherein inserting the shim comprises inserting the shim comprising a curved surface facing the at least one upper plate or lower plate.

9. The bonding method of claim 7, wherein inserting the shim comprises inserting the shim comprising a stepped surface facing the at least one upper plate or lower plate.

10. The bonding method of claim 7, wherein modifying the surface contours further comprises heating the upper plate and heating the lower plate.

11. The bonding method of claim 10, wherein heating the upper plate comprises uniformly heating the upper plate.

12. The bonding method of claim 10, wherein heating the upper plate comprises non-uniformly heating the upper plate.

13. The bonding method of claim 12, wherein non-uniformly heating the upper plate comprises controlling heating elements arranged in a concentric pattern.

14. The bonding method of claim 12, wherein non-uniformly heating the upper plate comprises controlling heating elements arranged in a non-concentric pattern.

15. A bonding method comprising:
    bonding a wafer to a carrier in a bonding system;
    measuring thickness profile of the bonded wafer; and
    modifying surface contours of at least one of an upper plate or a lower plate of a bonding system based on the measured thickness profile, wherein modifying the surface contours of at least one of the upper plate or the lower plate comprises:
    heating the upper plate;
    heating the lower plate; and
    exerting a physical force on the at least one of the upper plate or the lower plate by mechanically adjusting a height of at least one height adjuster of a plurality of height adjusters or by inserting a shim between a support structure of the bonding system and the at least one of the upper plate or the lower plate, wherein the physical force is exerted on a surface of the at least one of the upper plate or the lower plate opposite a surface configured to contact a wafer.

16. The bonding method of claim 15, wherein exerting the physical force comprises exerting the physical force using the plurality of height adjusters.

17. The bonding method of claim 16, wherein exerting the physical force comprises individually controlling at least one height adjusters of the plurality of height adjusters.

18. The bonding method of claim 15, wherein heating the lower plate comprises individually controlling a first plurality of heating elements adjacent to the lower plate.

19. The bonding method of claim 18, wherein heating the upper plate comprises individually controlling a second plurality of heating elements adjacent to the upper plate.

20. The bonding method of claim 15, wherein the inserting of the shim comprises inserting the shim comprising a curved surface facing the at least one upper plate or lower plate.

* * * * *